United States Patent [19]
Lyon et al.

[11] Patent Number: 5,153,882
[45] Date of Patent: Oct. 6, 1992

[54] SERIAL SCAN DIAGNOSTICS APPARATUS AND METHOD FOR A MEMORY DEVICE

[75] Inventors: Terry L. Lyon, Roseville, Minn.; Jeff Chritz, Vancouver, Wash.

[73] Assignees: National Semiconductor Corporation, Santa Clara, Calif.; Control Data Corporation, Minneapolis, Minn.

[21] Appl. No.: 502,192

[22] Filed: Mar. 29, 1990

[51] Int. Cl.⁵ .................................. G01R 31/28
[52] U.S. Cl. .................... 371/22.3; 371/21.1
[58] Field of Search ............. 371/22.3, 21.1, 22.1; 324/73.1

[56] References Cited

U.S. PATENT DOCUMENTS

| | | |
|---|---|---|
| 4,167,780 | 9/1979 | Hayashi . |
| 4,476,560 | 10/1984 | Miller et al. . |
| 4,553,090 | 11/1985 | Hatano et al. ............... 371/22.3 |
| 4,581,739 | 4/1986 | McMahon, Jr. ............. 371/22.3 |
| 4,667,325 | 5/1987 | Kitano et al. . |
| 4,697,267 | 9/1987 | Wakai ........................... 371/22.3 |
| 4,698,754 | 10/1987 | Koshino et al. . |
| 4,701,920 | 10/1987 | Resnick et al. . |
| 4,703,257 | 10/1987 | Nishida et al. . |
| 4,703,484 | 10/1987 | Rolfe et al. .................. 371/22.3 |
| 4,710,930 | 12/1987 | Hatayama et al. . |
| 4,743,840 | 5/1988 | Sato et al. . |
| 4,752,907 | 6/1988 | Si et al. ....................... 364/900 |
| 4,780,874 | 10/1988 | Lenoski et al. . |
| 4,897,838 | 1/1990 | Tateishi . |

Primary Examiner—Charles E. Atkinson
Attorney, Agent, or Firm—Irving S. Rappaport; Robert C. Colwell; Richard L. Hughes

[57] ABSTRACT

A scan diagnostics apparatus and method is useful in connection with the memory integrated circuit. A shift register is provided which can receive data in parallel from the input register and output the data serially. The shift register can receive serial data and output in parallel either to the input buffer or the output buffer. Preferably the shift register can receive in parallel, data from the output buffer and output the data serially.

21 Claims, 8 Drawing Sheets

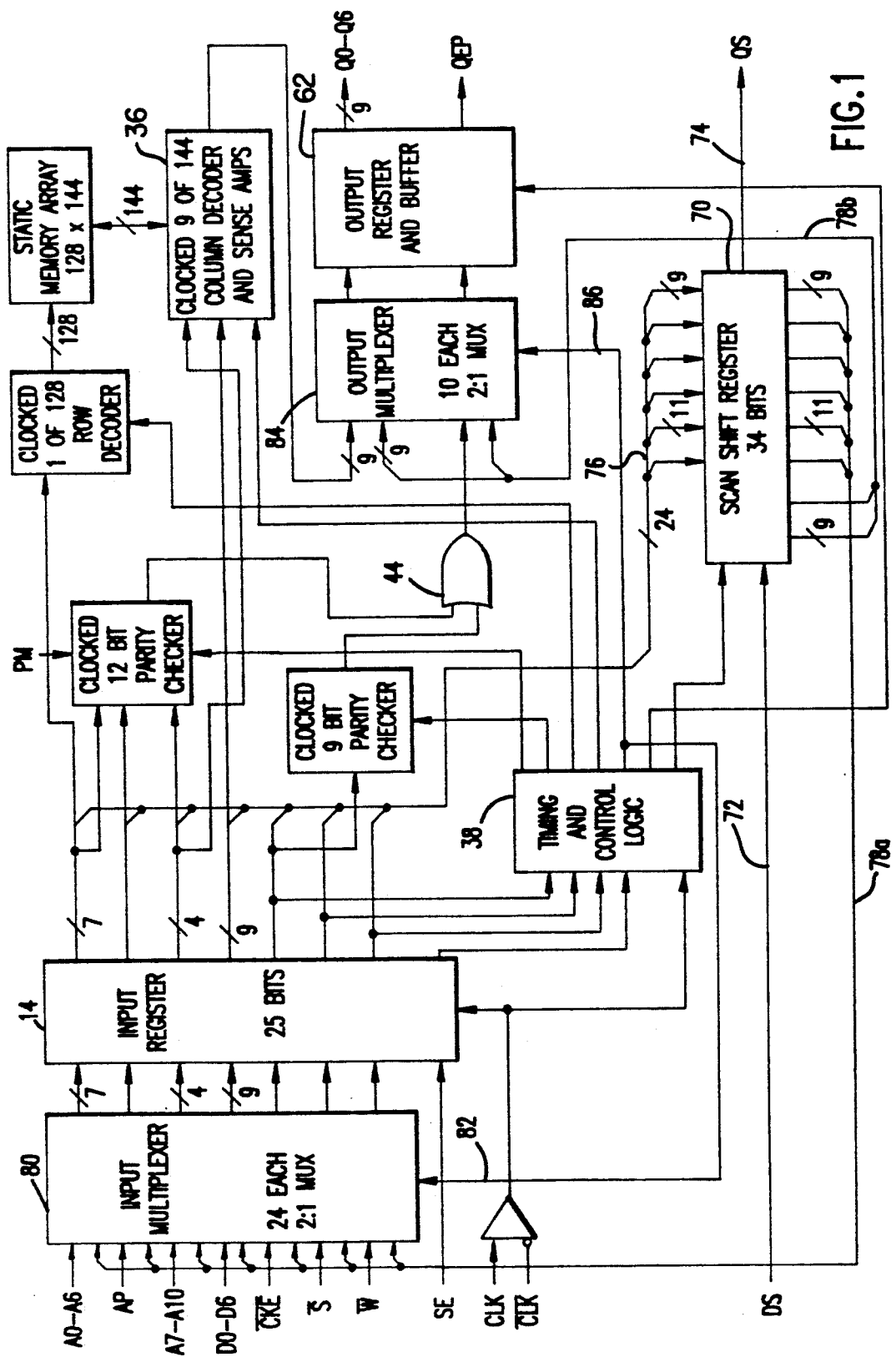

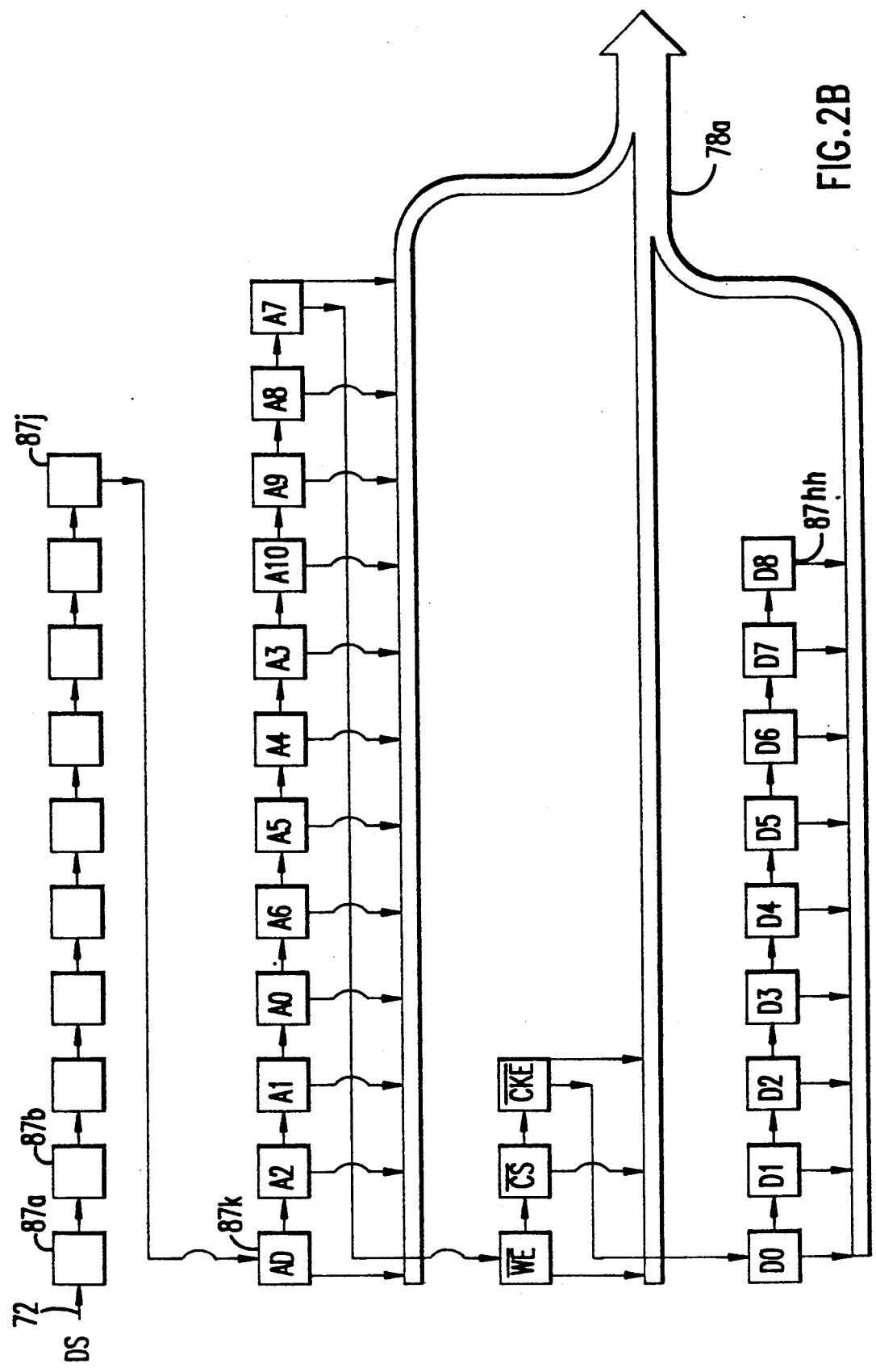

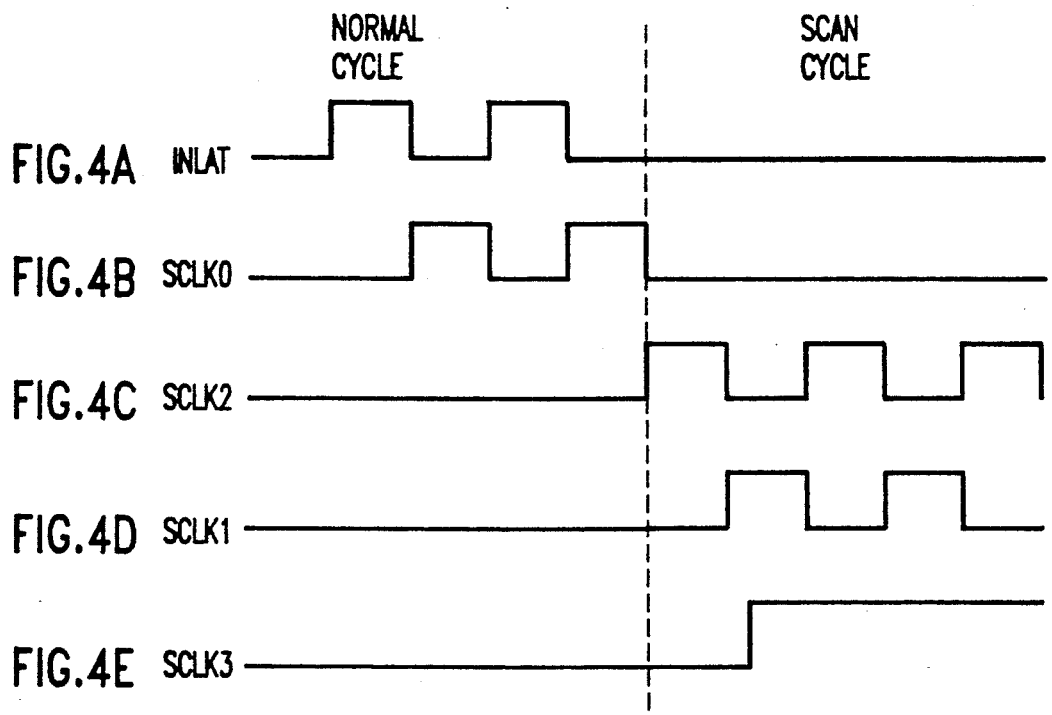
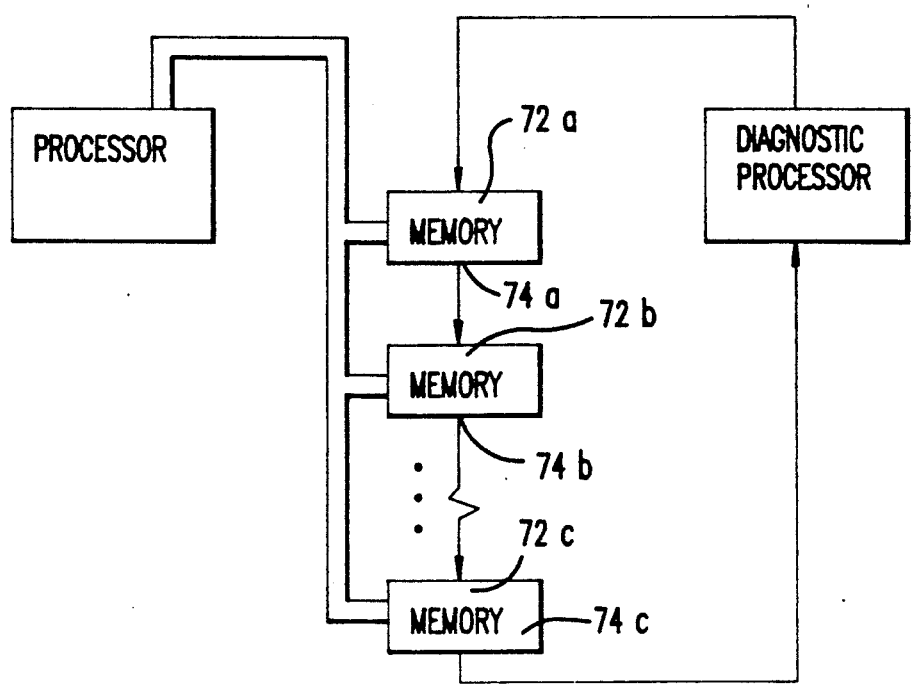
FIG.5

SERIAL SCAN DIAGNOSTICS APPARATUS AND METHOD FOR A MEMORY DEVICE

BACKGROUND OF THE INVENTION

The present invention relates to a method and apparatus for conducting scan diagnostics on a memory device and in particular to a scan diagnostics shift register for scan-out of an input register, forcing the state of an input register and forcing the state of an output register for a memory integrated circuit.

It has been known to conduct scan diagnostics on, e.g., a combinational logic chip, in conjunction with a scan diagnostics processor programmed to interpret the scan diagnostics output. In a combinational logic chip, scan diagnostics can be implemented by putting a two-stage latch in the logic path, several stages in from an input pin, and connecting these latches serially to form a chain that stretches from the serial input to serial output. The series of latches thus makes up a shift register. With each scan-enabled cycle, data is shifted one position in the register and the logic downstream from the latch will change state to correspond to the new value.

The type of scanning used in connection with combinational logic chips, however, cannot be effectively used in connection with a memory device. This is because in a memory chip, the input information is used to store data in the chip. If the memory chip were allowed to respond to every new bit that passes through the latches, as is done with scanning logic chips, an undesired write could result. It would be useful to obtain scan diagnostics for a memory chip in order to assist in the design and/or maintenance and repair of computer system components.

SUMMARY OF THE INVENTION

The present invention includes scan diagnostics circuitry useful in connection with a memory chip. The scan diagnostics circuitry preferably includes a serial scan shift register. In one embodiment of the invention, input signals which are received in the input register are provided to both the memory control circuitry and the shift register and are placed in the shift register in parallel, after which the input signals are serially output onto the serial output line of the shift register. In this way the state of the input register is captured in the shift register. The captured state of the input register can then be serially shifted out for analysis by, e.g., diagnostics circuitry. Capturing the state of the input register is useful, e.g., in determining whether addresses and/or data that were sent to a memory chip were changed before their receipt in the input buffer. By comparing data and/or addresses sent to the memory chip with the data and/or addresses received in the memory chip, transmission errors can be detected.

According to a further embodiment of the invention, control information is shifted into the shift register in serial fashion and output in parallel to the input register of the memory IC in order to permit forcing a desired set of input signals into the input register. Forcing the state of the input register (i.e. placing a known set of data in the input register) is useful, e.g., when an error has been discovered in a computer system and it is unknown whether the error occurred before signals arrived at a given IC or after such arrival. For example, a given IC may be known to produce errors when a write operation is performed on a given memory location. Such an error might, however, arise from erroneous signals arriving at the input register or from erroneous handling of correct signals. By forcing the state of the input register, it is known that the correct signals have arrived at the input register. Thus if the error occurs in response to a forced-input write of that memory location, it can be determined that the error lies in the operation of the integrated circuit and not prior to the receipt of data in the input register.

According to another embodiment of the present invention, data is serially shifted into the shift register and is thereafter conveyed to the output register of the memory device in parallel in order to force a desired set of output data into the output register. Forcing the state of the output register is useful, e.g., when it is known that erroneous data arrives at a downstream location, but it is not known whether the error occurs during transmission over bus lines or arose during operation of the memory chip. By providing known data at the output register, if erroneous data thereafter arrives at a downstream location, it can be determined that the data became corrupted after leaving the output register.

In one preferred embodiment, the scan diagnostics circuitry is capable of all three of the above-described operations, i.e. scan-out of the state of the input register, forcing the state of the input register and forcing the state of the output register.

According to a further embodiment of the present invention, data in the output register is provided in parallel fashion to the shift register and is thereafter shifted serially onto the serial output line of the shift register. In this way, the state of the output buffer can be captured and serially scanned-out for analysis by, e.g., diagnostics circuitry. Capturing the state of the output buffer is useful, e.g., in determining whether data received from a memory chip and known to be erroneous was erroneous when it was in the memory chip output buffer or became erroneous after leaving the output buffer of the memory chip.

BRIEF DESCRIPTION OF THE DRAWINGS

FIG. 1 is a schematic block diagram of a memory chip according to the present invention;

FIG. 2B is a schematic block diagram of a shift register similar to that shown in FIG. 2A but showing a state of the register during a forced-input operation;

FIG. 4, comprised of FIGS. 4A–4E, is a timing diagram showing the state of various clocks used during a normal sequence and a scan cycle according to the present invention; and FIG. 5 is a schematic block diagram of a computing system according to one embodiment of the invention.

DETAILED DESCRIPTION OF THE PREFERRED EMBODIMENTS

Figure 1A:
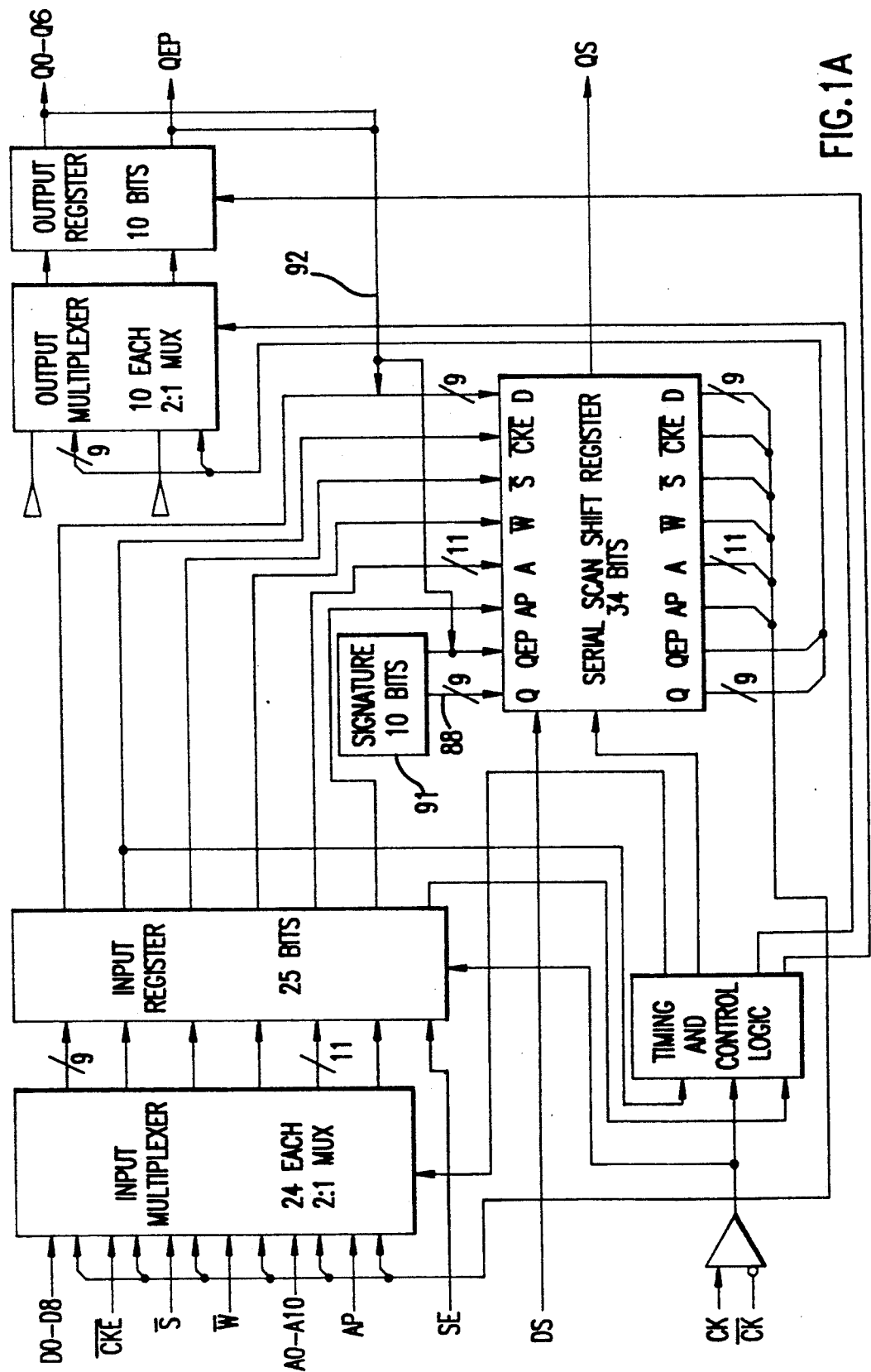
FIG. 1A is a block diagram of a memory chip according to the present invention showing circuitry used during a scan operation.

The present invention involves providing for scan diagnostics on a memory chip. Preferably, the apparatus used for obtaining the scan diagnostic data is provided on the memory integrated circuit or chip. FIG. 1 is a block diagram of such a memory chip. The embodiment depicted in FIG. 1 shows a 2k×9 memory chip 10 which includes a 128×144 static memory array 12. A memory chip such as that depicted can be used for a number of purposes including register files, writable control stores, cache RAM's, cache tag RAM's, and address translation look-aside buffers (TLBs). As will be apparent to those skilled in the art, the scan diagnostics scheme of the present invention can also be used in connection with other types of memories including other sizes of memories, dynamic memories, read only memories, as well as in connection with the memories used for other purposes such as main memory, buffers, and the like.

The embodiment depicted in FIG. 1 includes an input register 14 for receiving a number of input signals. These input signals include eleven address bits, depicted in FIG. 1 as arriving on two address busses 15a, 15b, an address parity signal 16, nine data bits arriving on a data bus 18, a clock enable ($\overline{CKE}$) signal 20, a chip select ($\overline{S}$) signal 22, a write enable ($\overline{W}$) signal 24, and a scan enable (SE) input 26. In all cases, an overbar indicates the complement of the signal.

In the depicted embodiment, the eleven address bits, denoted A0-A10 provide the capability to address 2k 9-bit words of memory. As will be apparent, other address sizes can also be used in connection with another memory configuration. The address parity (AP) input 16 is set or reset, e.g. by the processor (not shown) to ensure that the combination of the address bits A0-A10 and the address parity bit AP will have the desired parity, i.e. even or odd, as is well-known in the art. The clock enable ($\overline{CKE}$) input 20 when in its active state (low) permits the memory device 10 to function normally. In the preferred embodiment, during normal functioning, inputs are registered by a rising clock edge.

The chip select input 22 can be used to inhibit a write operation or force the device outputs to a deselected state when not writing. The write enable input 24 when active, allows a write operation to occur on each rising clock edge. The scan enable input 26 is used in connection with enabling the serial scan diagnostics mode, as described more fully below.

Timing for the memory device 10 is provided by a clock input (CK) 28 and its complement signal $\overline{CK}$ 29.

Two types of output are provided from memory chip 10 including nine bits 31 from a read operation and a parity error output 32. The parity error output is normally low. It assumes a high value when the registered inputs have a parity error.

The memory device 10 includes clocked row and column decoders and sense amps 34, 36 which are connected to the memory array 12 and operate in a well-known manner. Timing and control logic 38 receives control and clock signals 20 through 30 and provides clock and control signals to control operation of the device, in a well-known manner.

The parity checking performed in the memory chip 10 is accomplished using three logic circuits, a 12 bit address parity checking circuit 40, a nine bit data parity checking circuit 42, and a parity logic decode circuit 44.

The scan shift register 70 is used to provide the scan diagnostic data according to the present invention. The scan shift register 70 is sufficiently wide to hold all of the data needed for the particular scan diagnostics which the apparatus is configured to perform. When the apparatus is configured to perform a scan out of the input register, the scan shift register will be at least 25 bits deep. In the preferred embodiment, the scan shift register 70 is configured so that it can perform both a scan out of the input register, a forced state of the input register, and a forced state of the output register. In one embodiment of the invention, the shift register 70 can be used to scan-out the state of the output buffer. Accordingly, in the preferred embodiment the scan shift register has a width equal to the width of the output register plus the width of the input register. In the embodiment depicted in FIG. 1, the shift register 70 has a depth of 34 bits.

The scan shift register 70 includes a serial input line 72 and a serial output line 74. The scan shift register 70 also includes parallel input lines 76 and parallel output lines 78a, 78b. The parallel input lines 76, in the embodiment depicted in FIG. 1, are derived from the output lines of the input register. The first serial output line 78a is directed to a multiplexer 80. The multiplexer 80, in response to a control signal from a control line 82, determines whether the inputs delivered to the input register 14 are derived from the computer system data, address and control lines 15a through 30 or from the first parallel output line 78a from the scan shift register 70. The second parallel output line 78b is provided to an output multiplexer 84. The output multiplexer, in response to a control signal from the timing and control logic 38 determines whether the output register 62 receives data from the sense amps 36 and parity logic 44 or from the second parallel output bus 78b of the scan shift register 70.

FIG. 1A depicts those portions of the circuitry from FIG. 1 which are used during various types of diagnostic scan operations. Included in FIG. 1A is a signature bit generator 91 for providing signature bits to the scan register, as described below. Table I shows the outputs and types of operation resulting from various inputs during normal-mode and scan mode operation.

Figure 2A:
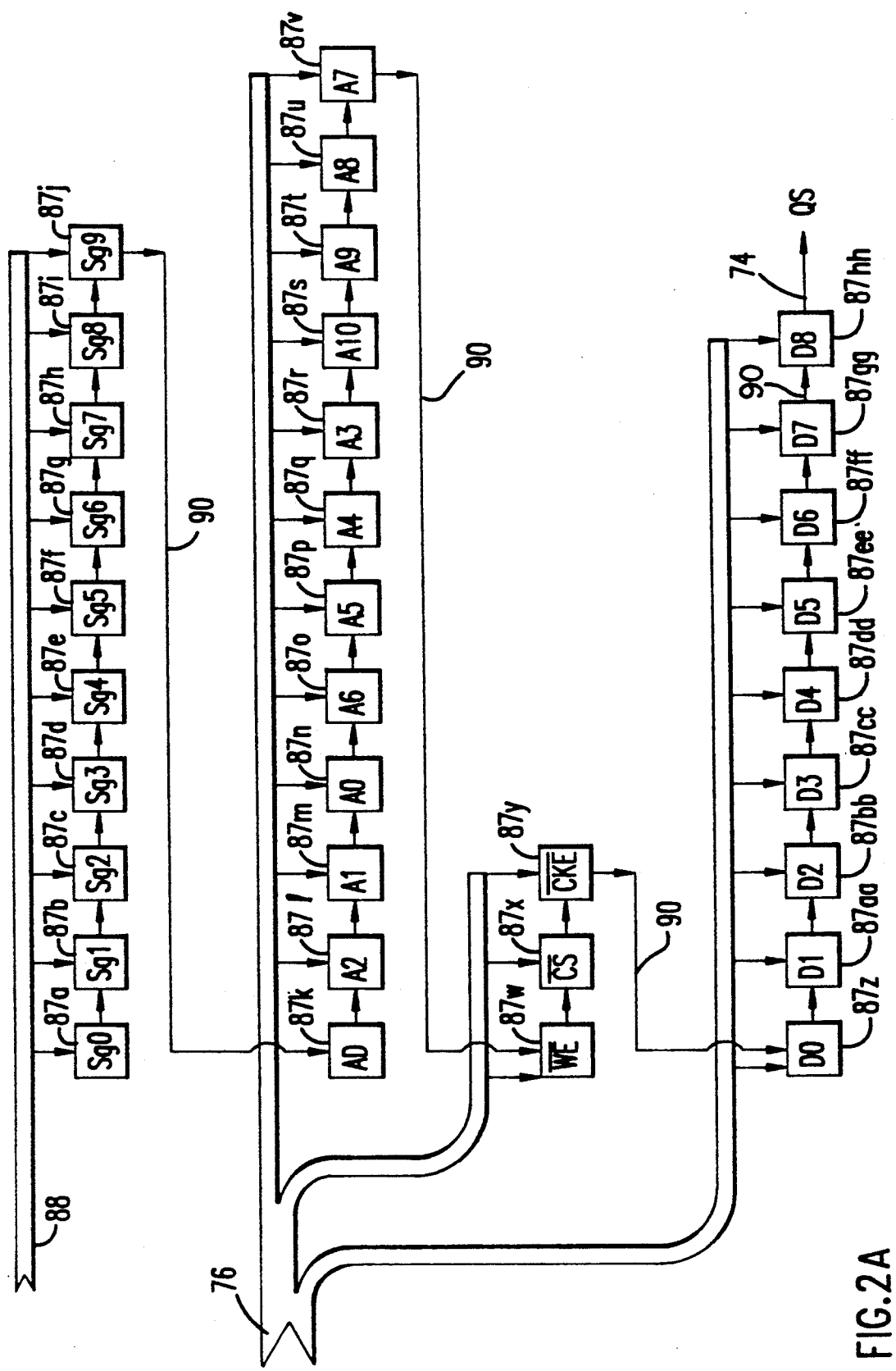
FIG. 2A is a schematic block diagram of a shift register usable in the embodiment shown in FIG. 1, showing a state of the register during a scan-out of the input register.

FIG. 2A is a schematic block depiction of a scan shift register showing the contents of the latches in the register during the first cycle of a scan-out operation. The contents of the input buffer latches are captured in the shift register 70 during every normal (non-scan) cycle. The purpose of a scan-out cycle is to output data which indicates the state of the input register so that the contents of the input register can not only control the operation of the memory chip but can be output in serial fashion for analysis by, e.g., a diagnostics processor (not shown). In a scan-out operation, the scan shift register 70 is loaded in a parallel fashion using the parallel input lines 76. As depicted in FIG. 2A, nine signature bits Sg0-Sg9 are loaded in parallel, over a bus 88, from a signature bit generator 91 (FIG. 1A). The nine signature bits Sg0-Sg9 form a sequence which is recognizable by the scan diagnostics processor as a scan signature. When the signature bits Sg0-Sg9 are shifted out as described below, the scan diagnostics processor, by comparing the received signature bits to expected signature bits, can determine where and/or if the serial scan chain is defective.

Simultaneously with the loading of the signature bits, the remainder of the register latches 87k through 87hh are loaded in parallel, from the parallel input lines 76 obtained from the output lines of the input register 14. Accordingly, the lower latches 87k through 87hh of the shift register 70 store the status of the input register.

After the shift register is placed in the configuration depicted in FIG. 2a, during subsequent clock cycles the data which was in the input register follows two paths. First, the data from the input register is conveyed to the parity checker, row and column decoders, and timing and control logic and the normal-mode portions of the memory chip function in the ordinary fashion. At the same time, during subsequent clock cycles, the data from the input register, having been stored in the shift register 70, is shifted out the shift register onto the output line 74. Thus, in a first clock cycle, the bit stored in the last latch 87hh is placed on the serial output line 74. Simultaneously, data in each latch in the serial shift register 70 is moved to the next latch along the serial register data path 90. Thus, after the contents of the last latch 87hh is shifted out, the contents of the next-to-last latch 87gg is shifted into the last latch 87hh and thence, onto the serial output line 74. In this way, the contents of all latches in the serial shift register are placed, serially, onto the serial output line 74, in a well-known manner.

The data placed onto the serial output line 74 can be treated in a number of manners. It can be sent directly to a diagnostics processor (not shown) for performing diagnostic procedures to identify any detectable malfunctions. Alternatively, the data on serial output line 74 can be provided to downstream memory devices to be stored for later analysis.

FIG. 2B depicts schematically the state of the shift register 70 at the last cycle of a forced-input diagnostics operation. To reach the configuration depicted in FIG. 2B, a serial stream of data was placed onto the serial input line 72 and scanned into the shift register 70. Thus, in the first cycle, e.g., a bit intended to be placed on the D8 data input line of the input register 14 was first placed into the first latch 87a. In the next cycle, this data was shifted into the second latch 87b and the next data bit, intended to be placed on the next-to-last data input line D7 of the input register 14, was shifted into the first latch 87a of the shift register 70. The shifting process was repeated 34 times to position the data in the registers as shown in FIG. 2B. The contents of the lower latches 87k–87hh are indicated in FIG. 2B by the symbols AP, A0-A10, $\overline{WE}$, $\overline{CS}$, $\overline{CKE}$ and D0-D8, having the meanings described above. In the preferred embodiment, only the lower latches 87k–87hh of the shift register 70 are used during a forced input operation, and accordingly, the contents of the upper latches 87a–87j of the register 70 are unimportant. In the cycle following that depicted in FIG. 2B, the data in latches 87k–87hh are placed, in parallel, onto the parallel output lines 78a of the shift register 70 and the input multiplexer 80 is set to provide data from the parallel output lines 78a to the input register 14. In this way, data which can be provided serially on a serial input line 72, such as from a pseudo-random data source (e.g., a properly programmed microprocessor, not shown) can be placed in the input register 14.

Figure 2C:
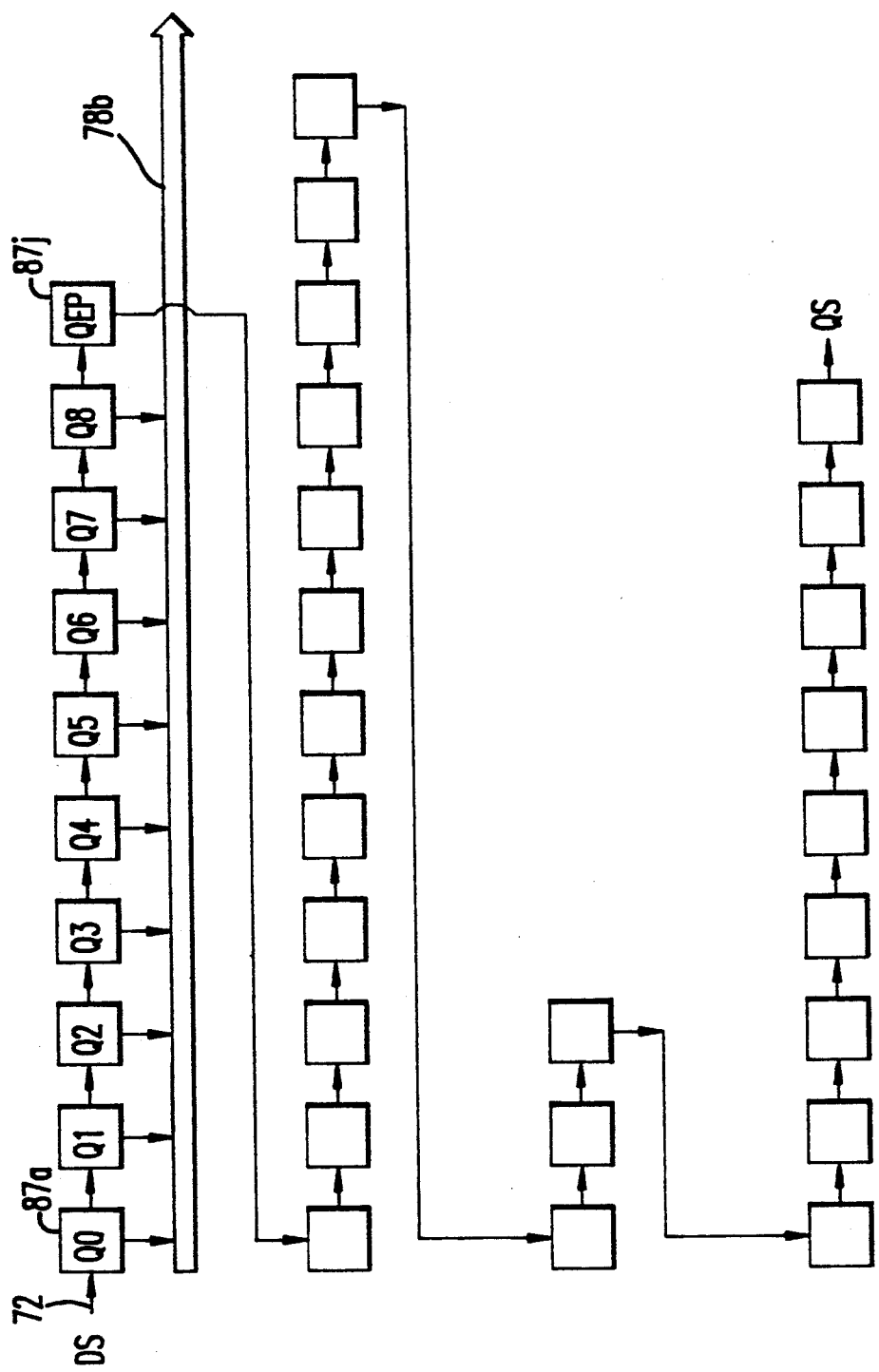
FIG. 2C is a schematic block diagram of a shift register, similar to FIG. 2A, but showing a state of the register during a forced-output operation.

FIG. 2C depicts, schematically, the state of the shift register 70 at the last shift cycle of a forced output diagnostics operation. In a forced output operation, data is provided from serial data input 72 and into the upper latches 87a–87j of the register 70. Thereafter, data in the upper latches of 87a–87j are placed, in parallel, onto the second parallel output lines 78b and the output multiplexer 84 is set to provide the data from the parallel output lines to the output register 62.

Figure 2D:
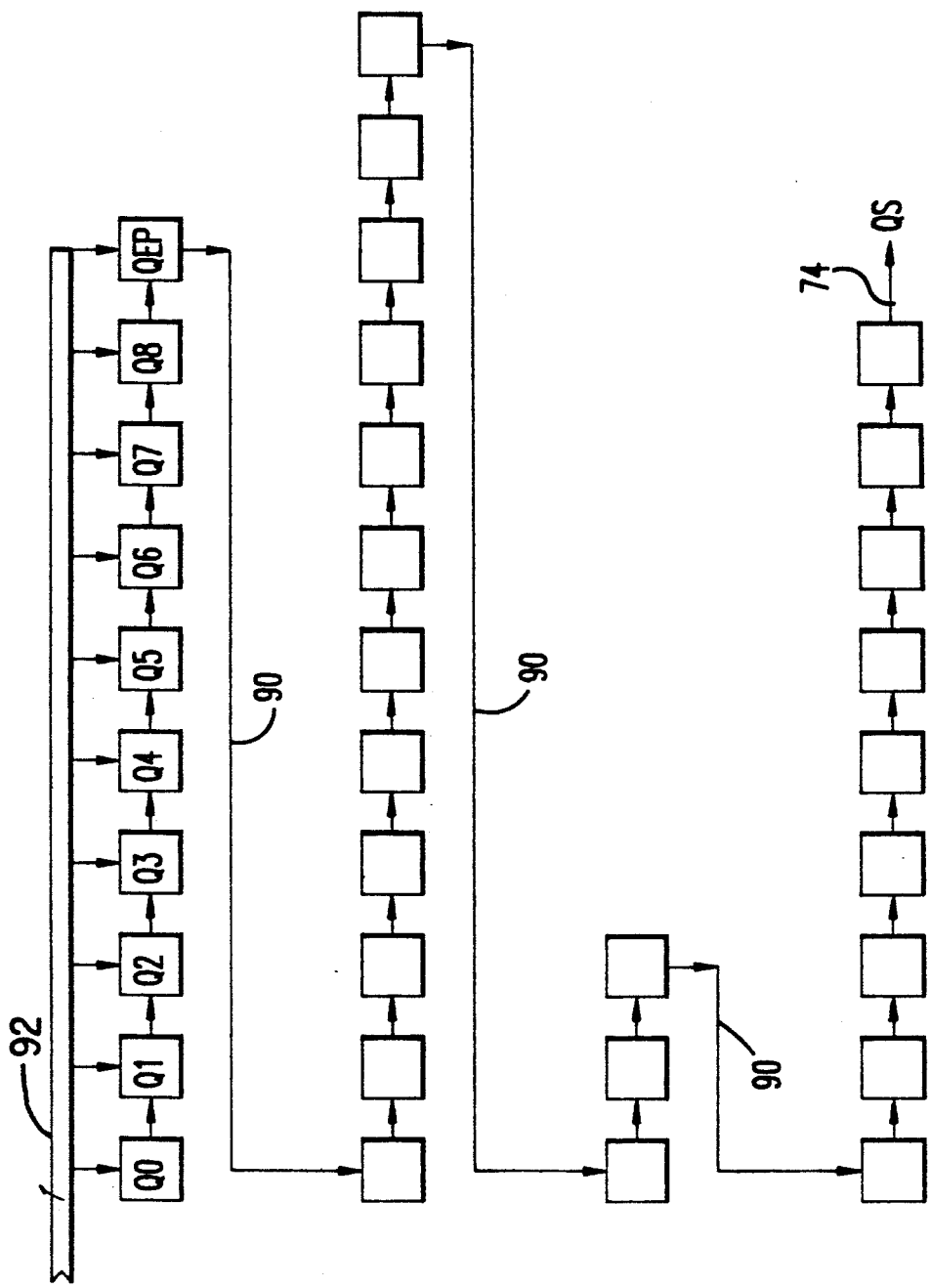
FIG. 2D is a schematic block diagram of a shift register similar to FIG. 2A, but showing a state of the register during a scan-out of the output register.

FIG. 2D depicts another embodiment of the invention in which data from the output register 62 is provided in parallel, using parallel input lines to latches in the shift register 70. Thereafter, the data can be shifted serially through the latches in the shift register 70 and onto the serial output line 74 for analysis by the diagnostics processor (not shown) or storage in memory.

A number of shift register devices can be used to construct the shift register 70. One such device is depicted generally in FIG. 3. For purposes of simplifying discussion, FIG. 3 depicts a shift register in which the parallel input 176a, 176b is two bits wide and the parallel output 178a, 178b is two bits wide.

Figure 3:
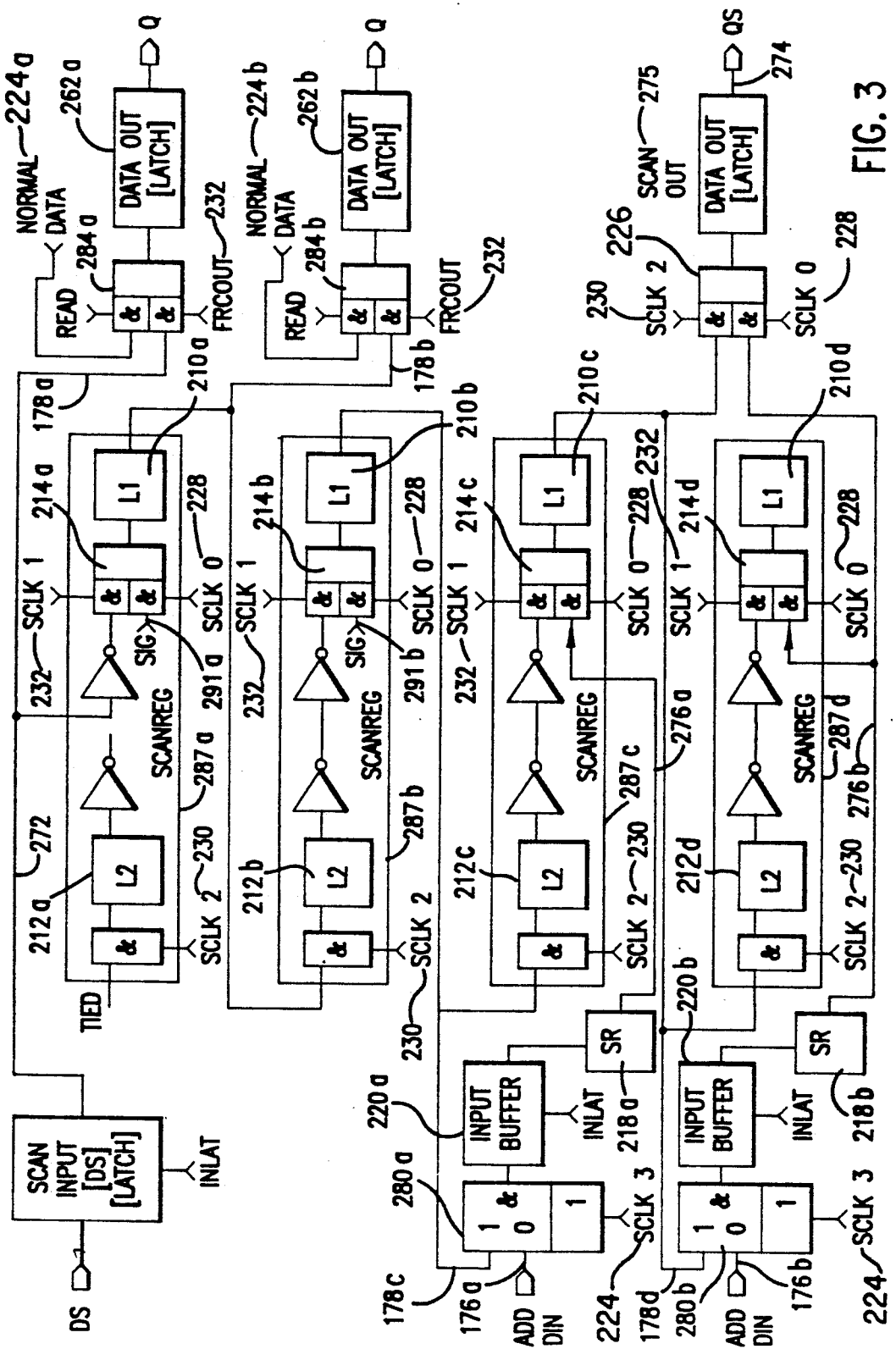
FIG. 3 is a schematic block diagram of a shift register in connection with the present invention having two-bit wide input and output registers.

The configuration depicted in FIG. 3 includes a plurality of two-phase latches 287a–287d. Each two-phase latch includes a second phase latch device 210a, 210b, 210c, 210d, respectively and a first phase latch device 212a, 212b, 212c, 212d, respectively. First multiplexers 214a, 214b, 214c, 214d determine whether the input for the second-phase latches 210a–210d is obtained from the parallel sources (the signature bit source 291a, 291b and shift register latch output lines 276a, 276b) or from the serial shift source (the scan input line 272 and first-phase latches 212b, 212c, 212d). The lower latch parallel input source lines 276a, 276b are derived from shift registers 218a, 218b, attached to portions of the input buffer 220a, 220b. Multiplexers 280a, 280b determine, in response to a clock signal SCLK3 224 whether the input buffer 220a, 220b receives its input from the input lines 176a, 176b (in parallel), or parallel output lines 178c, 178d. A second set of multiplexers 284a, 284b determine whether the output registers 262a, 262b obtain their data from the normal data sources 224a, 224b or from the scanned-in serial line 178a, 178b. Another multiplexer 226 determines whether the scan out latch 275 provides the serial output line 274 with data from the scan register latch 218b or the shift register latch 210c.

Table II is a state table depicting the state of various latches shown in FIG. 3. The first line of Table II shows the state of latches during a read or write cycle (i.e., a non-scan operation). The next four lines depict the configuration of various latches during four successive scan cycles of a scan-out operation. The last line depicts the state of latches during a scan exit cycle.

During a read/write (non-scan) cycle, signature bits Sg0, Sg1 are routed, by multiplexers 204a, 204b under control of the normal cycle clock SCLK0 228 to the first phase latches 210a, 210b. Data from the input pads 176a, 176b (denoted Pd2, Pd3 in Table II) are provided to the first phase latches 210c, 210d by the multiplexers 214c, 214d under control of SCLK0 228. The output multiplexer 226c provides Pd3, under control of SCLK0 to the data-out latch 275, as shown in the last column of Table II.

The operation of the scan register during a scan cycle is shown in the remaining lines of Table II. Operation of the scan register 70 is controlled by the timing and control logic 38. During serial operation the input to register L1 from the input buffer is disconnected and register L2 output is connected at the appropriate times by SCLK1. SCLK2 provides the other phase for this two-phase type shift register.

During scan cycles the register contents of L1 are input into the input buffer by SCLK3. Therefore, the chip is being controlled by scan and by not the external inputs. As depicted in Table I, operation during scan mode depends on both the current and the prior states of the scan enable (SE) signal, as well as the state of the clock enable (CKE) bit. When the prior scan enable signal is low and the current scan enable signal is high, the scan mode is entered and a first shift is conducted. The first shift is shown in the second line of Table II.

On the first and each succeeding clock rising edge with scan active (SE=high) the device will shift the serial shift register one bit. The state of the data scan input 72 is shifted into the chain of the register latches. The last bit of the chain is shifted out on the data output serial line 274. The other output lines remain unchanged. The rest of the RAM executes a "no operation". It will not write regardless of the state of the bit in the SE location of the input register during a scan mode operation. Any number of shifts can occur in scan mode.

FIG. 4 depicts timing of the clock signals INLAT, SCLK0 228, SCLK2 230, and SCLK1 232. In the first phase of operation, under control of SCLK2 230, data from latch 210a is shifted into latch 212b as shown in the Column "POS 1" under L2 of Table II. Similarly, the bit from 210b is shifted into 212c as shown in the Column "POS 2" under L2 of Table II. Pd2 is shifted from latch 210c into 212d. Next, under control of clock SCK1 the first data bit DS0 is shifted from the scan input line 272 into latch 210a and, in each of the lower registers 287b, 287c, 287d, data is shifted from the first phase latch 212b, 212c, 212d into the respective second phase latches 210b, 210c, 210d as depicted in Table II. The next three lines of Table II depict a serial shift occurring during each clock in which data is shifted from each latch 287 to the next succeeding latch. The serial shift occurs when the prior and current SE signal is high, as depicted in Table I. When the current SE drops to a low value (while the prior SE is high) a scan exit cycle is done. The type of scan exit which is conducted depends upon the value of the CKE, as shown in Table I. If CKE is low, the scan-in instruction is placed in the input buffer, 220a, 220b and the instruction represented by the scan-in data is executed. The output may be affected, according to the instruction executed. The contents of the scan register bits corresponding to the output register are ignored. If the CKE is high, the shift register data is copied onto the output lines but the instruction in the instruction register is not executed. The second and succeeding clock cycles after scan is inactive (SE=low) are defined as normal mode operations and do not cause any scan functions.

In the scan exit cycle depicted in Table II, if a force-out signal 232 is provided to the output multiplexer 284a, 284b, data from the latches 210a and the scan input 272 are provided over output lines 178a, 178b to the output latches 262a, 262b. If on the other hand, SCLK0 is repeatedly asserted, data will be scanned from the scan register latches 287a, 287d and placed on the serial output line 274 in serial fashion.

Several devices can be linked serially in a scan chain. In one embodiment, depicted in FIG. 5, the serial output 74a of a first memory chip is directed to the serial input 72b of a second memory chip. Three or more memory chips in the system can be daisy-chained to allow complete memory board inclusion.

In one embodiment of the invention, while a scan-in of data is occurring, it is possible to suspend the scan-in by setting the scan enable signal SE to low to permit execution of one or more normal memory cycles. Following the normal memory cycle execution, SE is set to a high value and scan-in of data is continued without any loss of data.

Based on the above description, a number of advantageous to the present invention will be apparent. Scan diagnostics can be provided in connection with a memory device for use in designing, modifying, maintaining, or repairing a memory device and/or a computer system. The device can be used to capture the state of the input buffer or the output buffer to be serially scanned-out for analysis by a diagnostics processor or for storage. The device can also be used to serially scan-in data which is to be forced into the input register or the output register of a memory chip.

A number of variations and modifications of the present invention can be used. Other types of memory devices such as DRAM memories can be used. Memories having different memory array sizes can be used.

Although the description of the invention has included a description of a preferred embodiment and various modifications and variations, other modifications and variations will be apparent to those skilled in the art, the invention being defined by the following claims.

TABLE I

| NORMAL MODE OPERATION | | | | | | | | | | |
|---|---|---|---|---|---|---|---|---|---|---|
| INPUTS | | | | | | | | OUTPUTS | | |
| CKE | S̄ | W̄ | A0-A10 | AP | PM | D0-D8 | DATA PARITY | Q | QEP | TYPE OF OPERATION |
| H | X | X | X | X | X | X | (X) | NC | NC | No operation |
| L | L | H | V | O | L | X | (X) | V | L | Read |
| L | L | H | V | E | H | X | (X) | V | L | Read |
| L | H | H | X | X | X | X | (X) | L | L | Deselect |
| L | L | H | V | E | L | X | (X) | V | H | Read, A Parity Error |
| L | L | H | V | O | H | X | (X) | V | H | Read, A Parity Error |
| L | L | L | V | O | L | V | (O) | NC | L | Write |
| L | L | L | V | E | H | V | (O) | NC | L | Write |
| L | H | L | X | X | X | X | (X) | NC | L | Write Inhibit |
| L | L | L | V | E | L | V | (O) | NC | H | Write, A Parity Error |
| L | L | L | V | O | H | V | (O) | NC | H | Write, A Parity Error |
| L | L | L | V | O | L | V | (E) | NC | H | Write, D Parity Error |
| L | L | L | V | E | H | V | (E) | NC | H | Write, D Parity Error |

| SCAN-MODE OPERATION | | | | | | | |
|---|---|---|---|---|---|---|---|
| INPUTS | | | | OUTPUTS | | | |
| PRIOR SE | CURRENT SE | SCANNED CKE | DS | QS | Q | QEP | TYPE OF OPERATION |

TABLE I-continued

| | | | | | | | |
|---|---|---|---|---|---|---|---|
| L | L | X | X | D8 | X | X | Normal Operation |
| L | H | X | X | D7 | NC | NC | Enter scan mode and do first shift |
| H | H | X | V | V | NC | NC | Serial shift on each clock |
| H | L | L | X | V | V/NC | V/NC | Exit scan mode; do last shift and then execute instruction scanned into input register; if read or deselect Q and QEP will update, else no change |
| H | L | H | X | V | V | V | Exit scan mode; do last shift and then copy scan register into Q and QEP; do not execute input instruction |

H = High
L = Low
X = Undefined
V = Valid
O = Odd
E = Even
NC = No Change

TABLE II

Scan Chain Position/Type

| Cycle Type | Clock | Scan-In (DS) Pad | Scan-In (DS) ADL | Pos 0 Data-Out L2 | Pos 0 Data-Out L1 | Pos 0 Data-Out Pad | Pos 1 Data-Out L2 | Pos 1 Data-Out L1 | Pos 1 Data-Out Pad | Pos 2 Address AdL | Pos 2 Address L2 | Pos 2 Address L1 | Pos 3 Address AdL | Pos 3 Address L2 | Pos 3 Address L1 | QS Scan Out Scan |
|---|---|---|---|---|---|---|---|---|---|---|---|---|---|---|---|---|
| Rd/Wr | Inlat | DC | DC | U | U | Q | U | U | Q | Pd2 | U | U | Pd3 | U | U | U |
| | sc_0 | | | | Sg0 | | | Sg1 | | | | Pd2 | | | Pd3 | Pd3 |
| Scan #1 | Inlat | DS_0 | DS_0 | | | DC | | | DC | U | | | U | | | |
| | sc_2 | DC | | 0 | | | Sg0 | | | | Sg1 | | | Pd2 | | |
| | sc_1 | DC | | | DS_0 | | | Sg0 | | | | Sg1 | | | Pd2 | Pd2 |
| Scan #2 | Inlat | DS_1 | DS_1 | | | | | | | Sg0 | | | Sg1 | | | |
| | sc_2 | DC | | 0 | | | DS_0 | | | | Sg0 | | | Sg1 | | |
| | sc_1 | DC | | | DS_1 | | | DS_0 | | | | Sg0 | | | Sg1 | Sg1 |
| Scan #3 | Inlat | DS_2 | DS_2 | | | | | | | DS_0 | | | Sg0 | | | |
| | sc_2 | DC | | 0 | | | DS_1 | | | | DS_0 | | | Sg0 | | |
| | sc_1 | DC | | | DS_2 | | | DS_1 | | | | DS_0 | | | Sg0 | Sg0 |
| Scan #4 | Inlat | DS_3 | DS_3 | | | | | | | DS_1 | | | DS_0 | | | |
| | sc_2 | DC | | 0 | | | DS_2 | | | | DS_1 | | | DS_0 | | |
| | sc_1 | DC | | | DS_3 | | | DS_2 | | | | DS_1 | | | DS_0 | DS_0 |
| Scan Exit Cycle | Inlat | DS_4 | DS_4 | | | | | | | DS_2 | | | DS_1 | | | |
| | sc_2 | DC | | 0 | | | DS_3 | | | | DS_2 | | | DS_1 | | |
| | sc_1 | DC | | | DS_4 | | | DS_3 | | | | DS_2 | | | DS_1 | DS_1 |
| | Frc_0 | DC | | | | DS_4 | | | DS_3 | | | | | | | |
| | sc_0 | Q | DC | 0 | S | | DS_2 | S | | DS_2 | DS_2 | DS_2 | DS_1 | DS_1 | DS_1 | DS_1 |

DC = Don't Care
U = Unknown
Pd1, Pd2 = bits from pads normally associated with that position
DS_0 . . . 4 = Scan Serial Bit Stream
Sg0 . . . Sg1 = Signature Bits

What is claimed is:

1. In a memory integrated circuit for storing a plurality of bits in a memory array having a plurality of memory locations, apparatus for performing scan diagnostics comprising:
   an input register for receiving signals in parallel;
   an output register for outputting signals in parallel;
   a memory control means coupled to a memory array and coupled to said input register and said output register;
   a shift register for receiving as input at least one of three data inputs, said three data inputs being a serial data stream, parallel data from said input buffer and parallel data from said output buffer and for outputting at least one of three outputs, said three outputs being a serial data stream, parallel data output to said input register, and parallel data output to said output register.

2. Apparatus, as claimed in claim 1, wherein said memory array and said shift register are formed on a single integrated circuit chip.

3. Apparatus, as claimed in claim 1, wherein said shift register has a parallel input means and a serial output means, and further comprising:
   bus means coupling said input register to said shift register and to said memory control for permitting receipt of at least some of said input signals in both of said shift register and said memory control means in parallel; and
   means for serially outputting said input signals onto said serial output line of said shift register to provide a scan-out of the state of the input register.

4. Apparatus, as claimed in claim 3, wherein said input signals output on said output line include all of the input signals received in said input register.

5. Apparatus, as claimed in claim 3, wherein said memory array is coupled to a diagnostics processor and further comprising means for conveying said input signals to said diagnostics processor.

6. Apparatus, as claimed in claim 3, wherein said receipt in said shift register and said memory control is substantially simultaneous.

7. Apparatus, as claimed in claim 1, wherein said shift register has a serial input line and a parallel output line, said parallel output line being coupled to said input register, and further comprising:
- means for serially receiving a plurality of input signals onto said serial input line of said shift register and shifting said input signals into said shift register;
- means for outputting said input signals from said shift register onto said output line in parallel for receipt by said input register to force the state of said input register.

8. Apparatus, as claimed in claim 7, wherein all of said input signals during at least one memory cycle are received in said input buffer from said means for outputting.

9. Apparatus, as claimed in claim 7, wherein said plurality of input signals is generated by a pseudo-random generator.

10. Apparatus, as claimed in claim 7, further comprising means for interrupting said means for serially receiving to permit execution of at least one memory cycle.

11. Apparatus, as claimed in claim 7, further comprising input multiplexer means for selectably providing said input signals on said output lines to said input register.

12. Apparatus, as claimed in claim 1, wherein said shift register has a serial input line and a parallel output line coupled to said output register and further comprising:
- means for serially receiving a plurality of output signals onto said input line of said shift register and shifting said output signals into said shift register;
- means for outputting said output signals from said shift register onto said output line in parallel for receipt by said output register, to force the state of the output register.

13. Apparatus, as claimed in claim 12, wherein all output signals received in said output register in at least a first memory cycle are received from said parallel output line of said shift register.

14. Apparatus, as claimed in claim 12, further comprising means for interrupting said means for serially receiving to permit execution of at least one memory cycle.

15. Apparatus, as claimed in claim 12, further comprising output multiplexer means for selectably providing said output signals on said output lines to said output register.

16. Apparatus, as claimed in claim 1, wherein said shift register has a parallel input and a serial output line, and further comprising:
- bus means coupling said output register to said shift register for permitting receipt of said output signals in said shift register in parallel; and
- means for serially outputting said output signals onto said output line of said shift register to provide a scan-out of the state of the output buffer.

17. Apparatus, as claimed in claim 16, wherein said output signals output on said output line include all of the output signals received in said output register.

18. In a memory system including at least a first integrated circuit having a memory array said memory system coupled to a parallel input bus, a shift register device for use in scan diagnostics, comprising:
- a plurality of two-phase latch portions, each portion comprising a first phase latch and a second phase latch coupled to said first phase latch and a multiplexer means for selecting the input for said second phase latch between a serial data source and a parallel data source;
- an input buffer for providing data in parallel to at least some of said plurality of latch portions;
- multiplexer means for selecting the input for said input buffer between said parallel input bus and at least some of said plurality of said second-phase latches;
- an output buffer for receiving data in parallel from at least some of said plurality of latch portions;
- multiplexer means for selecting the input for said output buffer between said memory array and at least some of said plurality of second-phase latches;
- means for serially receiving data into said latch portions; and
- means for serially outputting data from said latch portions.

19. Apparatus, as claimed in claim 18, further comprising:
- at least a second memory integrated circuit having a shift register with a serial input means; and
- means for coupling said means for serially outputting data from said latch portions of said first integrated circuit to said serial input means of said second memory integrated circuit.

20. In a memory integrated circuit for storing a plurality of bits in memory locations, a method for obtaining an indication of a plurality of input signals input to said integrated circuit comprising:
- providing an input register;
- receiving said plurality of input signals in said input register in a parallel fashion;
- providing a shift register having a parallel input and a serial output line;
- providing a memory control means coupled to a memory array;
- coupling said input register to said shift register and to said memory control for permitting receipt of said input signals in both of said shift register and said memory control means in parallel;
- serially outputting said input signals onto said output line of said shift register.

21. In a memory integrated circuit for storing a plurality of bits in memory locations, a method for performing scan diagnostics comprising:
- providing an input register for receiving signals in parallel;
- providing an output register for outputting signals in parallel;
- providing a memory control means coupled to a memory array and coupled to said input register and said output register;
- providing a shift register having a parallel input, a serial input, a parallel output and a serial output; and
- receiving as input to said shift register, at least one of three data inputs, said three data inputs being a serial data stream, parallel data from said input buffer and parallel data from said output buffer and for outputting at least one of three outputs, said three outputs being a serial data stream parallel data output to said input register and parallel data output to said output register.

* * * * *